United States Patent
Su et al.

(10) Patent No.: US 7,202,916 B2
(45) Date of Patent: Apr. 10, 2007

(54) TELEVISION TUNER AND METHOD OF PROCESSING A RECEIVED RF SIGNAL

(75) Inventors: Tung-Ming Su, Kao-Hsiung Hsien (TW); Dsun-Chie Twu, Hsin-Chu Hsien (TW); Liang-Hui Lee, Tai-Nan (TW)

(73) Assignee: Realtek Semiconductor Corp., HsinChu (TW)

( * ) Notice: Subject to any disclaimer, the term of this patent is extended or adjusted under 35 U.S.C. 154(b) by 385 days.

(21) Appl. No.: 10/707,438

(22) Filed: Dec. 15, 2003

(65) Prior Publication Data

US 2005/0128363 A1  Jun. 16, 2005

(51) Int. Cl.
*H04N 5/50* (2006.01)
(52) U.S. Cl. .................................................. 348/731
(58) Field of Classification Search ............... 348/731, 348/725, 732, 726; 455/315, 179.1, 189.1, 455/296, 190.1, 191
See application file for complete search history.

(56) References Cited

U.S. PATENT DOCUMENTS

| | | | |
|---|---|---|---|
| 4,320,536 A | 3/1982 | Dietrich | |
| 4,581,643 A | 4/1986 | Carlson | |
| 5,325,129 A | 6/1994 | Henry et al. | |
| 5,517,687 A | 5/1996 | Niehenke et al. | |
| 5,589,791 A | 12/1996 | Gilbert | |
| 5,737,035 A * | 4/1998 | Rotzoll | 348/725 |
| 5,742,357 A * | 4/1998 | Griesbaum | 348/731 |
| 5,802,447 A | 9/1998 | Miyazaki | |
| 5,826,182 A | 10/1998 | Gilbert | |
| 5,847,612 A * | 12/1998 | Birleson | 331/2 |
| 5,950,112 A | 9/1999 | Hori et al. | |
| 6,028,493 A | 2/2000 | Olgaard et al. | |
| 6,029,059 A | 2/2000 | Bojer | |
| 6,091,303 A | 7/2000 | Dent | |
| 6,122,497 A | 9/2000 | Gilbert | |
| 6,127,962 A * | 10/2000 | Martinson | 342/20 |
| 6,177,964 B1 | 1/2001 | Birleson et al. | |
| 6,243,569 B1 | 6/2001 | Atkinson | |
| 6,307,894 B2 | 10/2001 | Eidson et al. | |
| 6,370,372 B1 | 4/2002 | Molnar et al. | |
| 6,480,236 B1 * | 11/2002 | Limberg | 348/555 |
| 6,496,229 B1 * | 12/2002 | Limberg | 348/725 |
| 6,724,440 B1 | 4/2004 | Suan et al. | |
| 6,724,441 B2 * | 4/2004 | Choi | 348/731 |

(Continued)

FOREIGN PATENT DOCUMENTS

CN        1347203 A       5/2002

(Continued)

*Primary Examiner*—Paulos Natnael
(74) *Attorney, Agent, or Firm*—Winston Hsu

(57) ABSTRACT

A television (TV) tuner includes a first mixer having an input terminal coupled to a received RF signal for producing an intermediate frequency signal, a notch filter having an input terminal coupled to the intermediate frequency signal for removing a first range of signals centered at a first center frequency in the intermediate frequency signal, a band-pass filter having an input terminal coupled to the intermediate frequency signal for passing a second range of signals centered at a second center frequency in the intermediate frequency signal, and a second mixer having inputs coupled to a filtered intermediate frequency signal for producing a first output signal. The filtered intermediate frequency signal is received from an output of the notch filter and the band-pass filter.

15 Claims, 8 Drawing Sheets

U.S. PATENT DOCUMENTS

| | | |
|---|---|---|
| 6,725,463 B1 * | 4/2004 | Birleson .................... 725/151 |
| 6,807,405 B1 * | 10/2004 | Jagger et al. ............... 455/296 |
| 6,888,580 B2 | 5/2005 | Dujmenovic |
| 6,934,523 B2 | 8/2005 | Yasuda |
| 6,995,808 B2 | 2/2006 | Kovacic et al. |
| 6,999,747 B2 | 2/2006 | Su |
| 7,006,162 B2 | 2/2006 | Cowley et al. |
| 7,019,598 B2 | 3/2006 | Duncan et al. |
| 7,019,790 B2 | 3/2006 | Yamamoto |
| 2002/0054651 A1 * | 5/2002 | Posti ......................... 375/316 |
| 2005/0235333 A1 | 10/2005 | Bertonis et al. |

FOREIGN PATENT DOCUMENTS

| | | |
|---|---|---|
| KR | 2002030379 A | 4/2002 |

* cited by examiner

TELEVISION TUNER AND METHOD OF PROCESSING A RECEIVED RF SIGNAL

CROSS REFERENCE TO RELATED APPLICATIONS

This is a copending application to application Ser. No. 10/604,018, filed on Jun. 22, 2003, entitled "Passive Harmonic Mixer" and assigned to the same assignee, the contents of which are incorporated herein by reference. This is also a copending application to application Ser. No. 10/707,319, filed on Dec. 4, 2003, entitled "Harmonic Mixer Based Television Tuner And Method of Processing a Received RF Signal" and assigned to the same assignee, the contents of which are incorporated herein by reference.

BACKGROUND OF INVENTION

1. Field of the Invention

The invention relates to television tuners, and more particularly, to a double conversion television tuner used to process a received RF signal.

2. Description of the Prior Art

One of the most significant costs in television manufacturing is the cost of the tuner. Furthermore, with the increasing desire to integrate TV functions into personal computer (PC) systems and other electronic devices, the cost of the tuner needs to be reduced. TV tuners may be fabricated on circuit boards and then installed in personal computer systems, thereby allowing the PC to function as a television set. These tuners convert a radio frequency television signal into a baseband (or low frequency) video signal, which can then be passed on to other elements in the PC for video processing applications.

FIG. 1 shows a highly integrated television tuner 100 disclosed by U.S. Pat. No. 5,737,035. The television tuner 100 includes an adjustable low noise amplifier 101, a first mixer 102, a first local oscillator 104, a band-pass filter 106, a second mixer 108, being an image rejection type mixer, a second local oscillator 110, a first intermediate frequency amplifier 112, a second band-pass filter 114, and a variable intermediate frequency amplifier 116.

FIG. 2 shows a frequency domain plot of a filtered intermediate frequency signal 109 in FIG. 1. By adjusting the frequency of the first local oscillator 104, a selected carrier frequency in the received RF signal is positioned in the first intermediate frequency signal (IF1) at 1220 MHz. This desired signal is allowed to pass through the band-pass filter 106, which has a center frequency of 1220 MHz, and results in the desired signal 200 shown in FIG. 2. The desired signal 200 is then mixed by the second mixer 108 with a reference signal (LO) from the second local oscillator 110 at 1176 MHz to produce an output signal at 44 MHz. However, the second local oscillator 110 also mixes an image signal 202 located at 1132 MHz with the 1176 MHz reference signal, and this too produces an output signal at 44 MHz. In other words, both the desired signal 200 and the image signal 202 are located in the output 111 of the second mixer 108 at 44 MHz.

In order to prevent the image signal 202 from interfering with the desired signal when mixed with the second mixer 108, the power level of the desired signal $P_1$ should be higher than the power level of the image signal $P_2$ before entering the second mixer 108. For example, a typical image attenuation requirement specifies the image signal 202 be at least 50 dB below the desired signal 200. As the image signal 202 is only 88 MHz away from the desired signal 200, it is very difficult to build the band-pass filter 106 with such a sharp fall-off. For this reason, the second mixer 108 is required to be an image rejection type mixer in order to prevent the image signal 202 from appearing in the output 111 of the second mixer 108.

FIG. 3 shows a Hartely architecture image rejection mixer 300 as described by Razavi on pages 139 to 144 of the textbook "RF Microelectronics". The Hartely architecture image rejection mixer 300 receives the filtered intermediate frequency signal 109 and includes a first mixer 302, a first low-pass filter 304, a 90° phase-delay unit 306, a second mixer 308, and a second low-pass filter 310. The output of the 90° phase-delay unit 306 and the second low-pass filter 310 are added by an adder 312 to form the output 111 of the mixer.

Although the Hartely architecture image rejection mixer 300 prevents the image signal 202 from appearing in the output 111, the Hartley architecture image rejection mixer 300 increases the overall design complexity of the tuner; increases the power consumption of the tuner due to using two mixers 302, 308; and because the filtered intermediate frequency signal 109 is first divided into in-phase I and quadrature Q signal paths using the first mixer 302 and the second mixer 308, if there is any mismatch caused by the 90° phase-delay unit not being exactly 90°, the Hartely architecture image rejection mixer 300 also results in decreased performance due to incomplete image rejection and/or gain mismatch between the two paths. This mismatch between the two paths is especially serious for signals such a digital TV signals which have a very strict QAM256 I, Q mismatch requirement.

Razavi, on pages 144 to 146 of the textbook "RF Microelectronics", also describes a Weaver architecture image rejection mixer, which is another image rejection mixer architecture used in the prior art. The Weaver architecture replaces the 90° phase-delay unit 306 with a second a second quadrature mixing operation, which performs the same function as the 90° phase-delay unit 306. However, the Weaver architecture image rejection mixer shares the same problems as the Hartely architecture image reject mixer 300, specifically: increased overall design complexity, increased power consumption, and incomplete image rejection due to gain and phase mismatch.

SUMMARY OF INVENTION

According to the claimed invention, a television (TV) tuner is disclosed comprising a first mixer for producing an intermediate frequency signal according to a received RF signal, a notch filter for filtering an image signal of the intermediate frequency signal, a band-pass filter for passing the intermediate frequency signal, and a second mixing unit for producing an output signal according to the passed intermediate frequency signal.

Also according to the claimed invention, a method is disclosed for processing a received RF signal, the method comprising mixing the received RF signal to produce a first intermediate frequency signal, filtering an image signal of the first intermediate frequency signal using a notch filter, passing the first intermediate frequency signal using a band-pass filter, and mixing the passed first intermediate frequency signal to produce an output signal.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
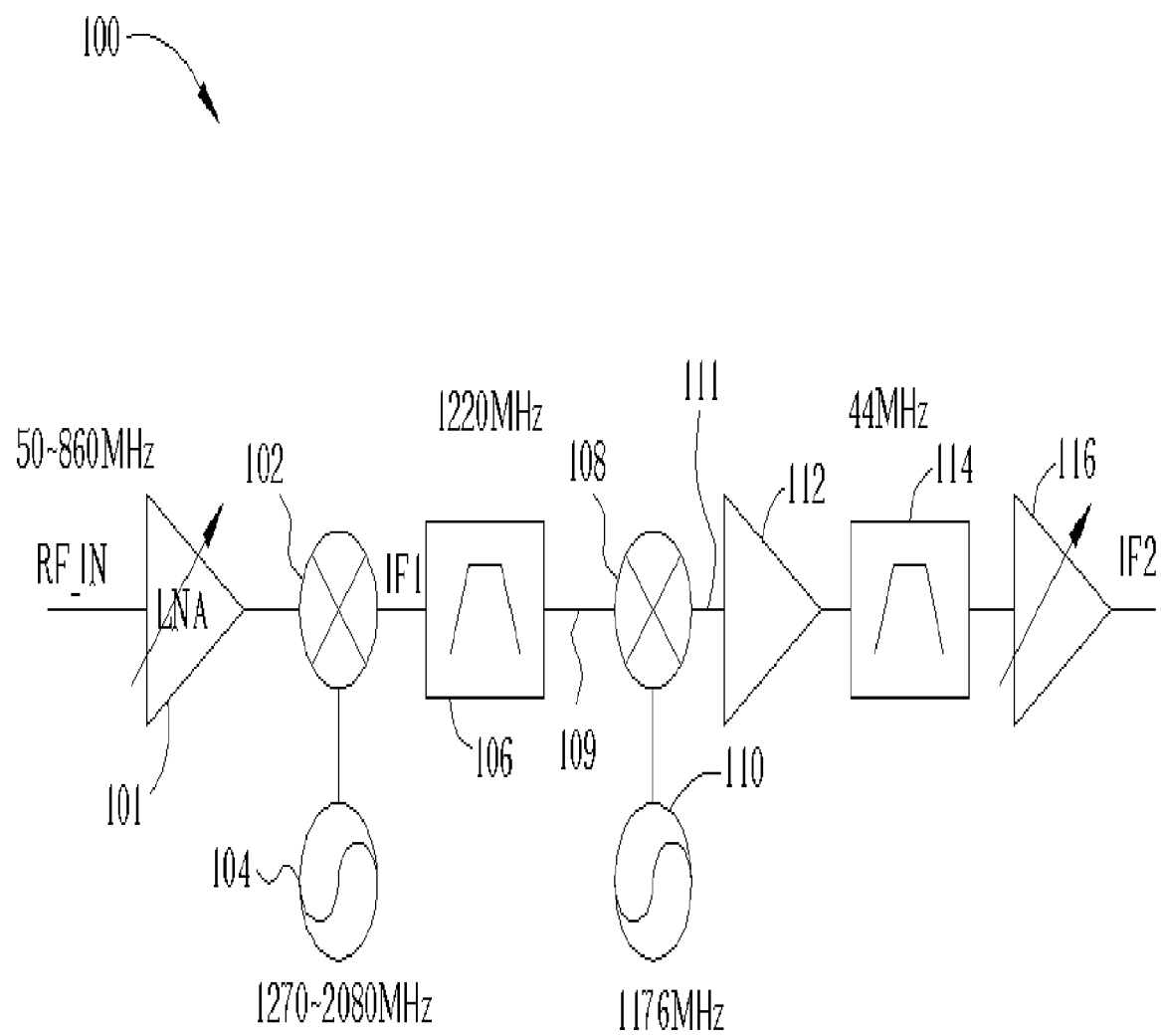
FIG. 1 is a block diagram showing the architecture of a conventional television tuner.
Figure 2:
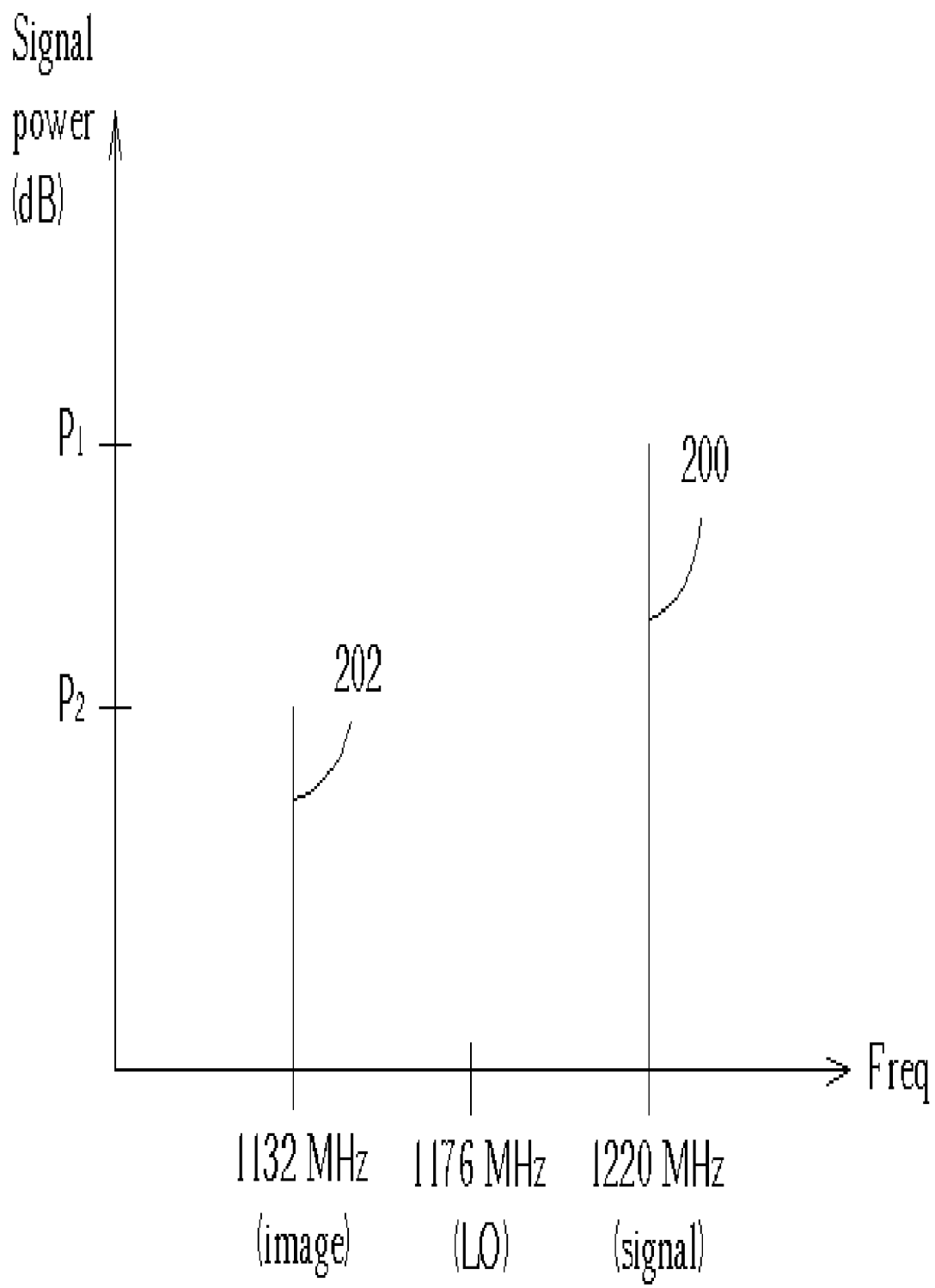
FIG. 2 is a frequency domain plot of the intermediate frequency signal (IF1) in FIG. 1.
Figure 3:
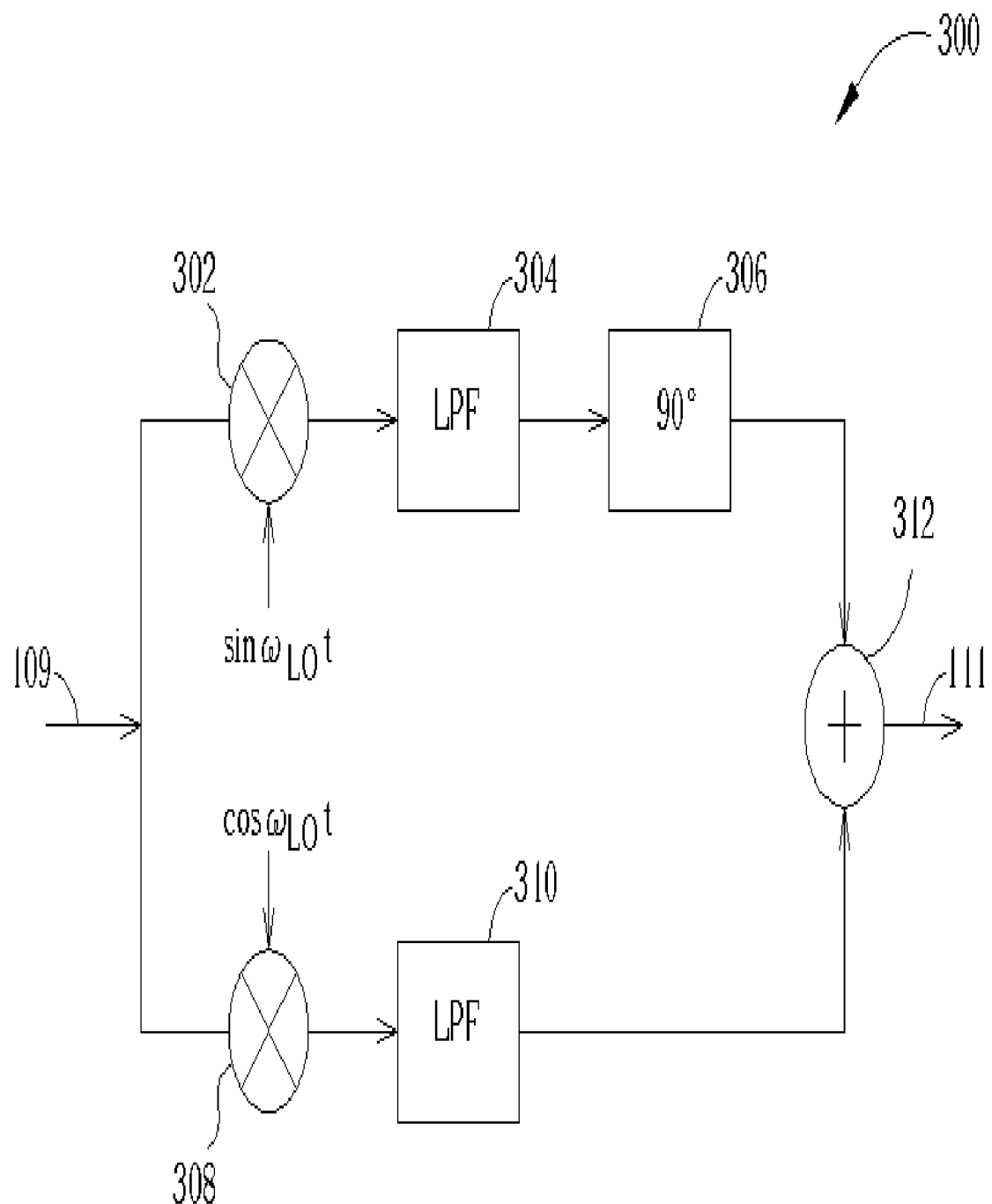
FIG. 3 is a block diagram showing the architecture of a Hartely image rejection mixer.
Figure 4:
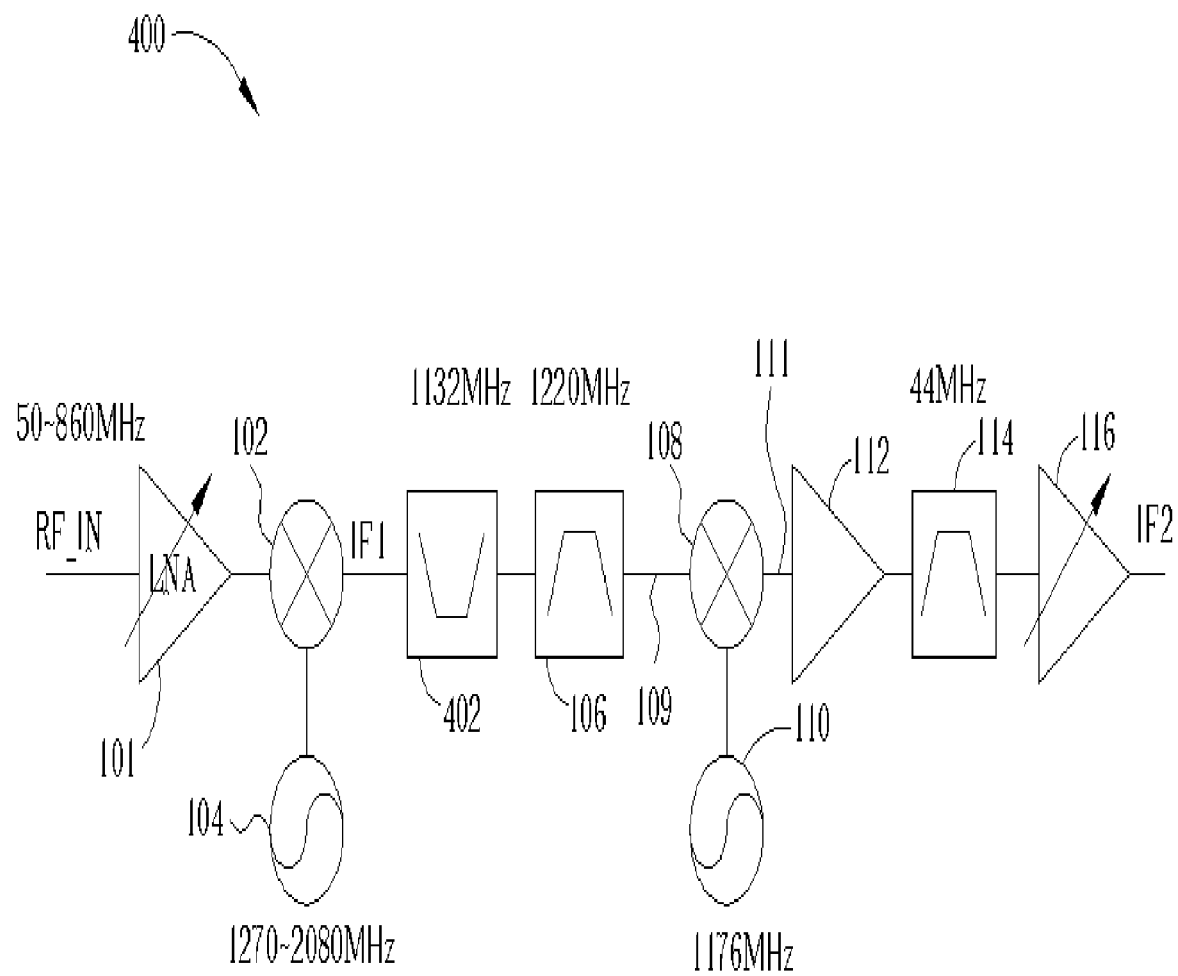
FIG. 4 is a block diagram showing the architecture of a television tuner according to a first embodiment of the present invention.

FIG. 4 shows the architecture of a television tuner 400 according to a first embodiment of the present invention. The television tuner 400 includes the same components as the conventional television tuner 100 shown in FIG. 1 with the addition of a notch filter 402 added between the first mixer 102 and the first band-pass filter 106.

The notch filter 402 removes a first range of frequencies centered at the image frequency of 1132 MHz from the first intermediate frequency signal IF1. By using the notch filter 402, the power level $P_2$ of the image signal 202 is further lowered. The combination of the band-pass filter 106 and the notch filter 402 allows the power difference between the image signal 202 and the desired signal 200 to be much greater than when only the band-pass filter 106 is used. In this way, the filtered intermediate frequency signal 109 output by the band-pass filter 106 easily meets the image attenuation requirement, which typically specifies that the image signal 202 be at least 50 dB below the desired signal 200. Additionally, the notch filter 402 does not cause an I, Q mismatch and, particularly if a passive implementation is used, consumes very little power.

Figure 5:
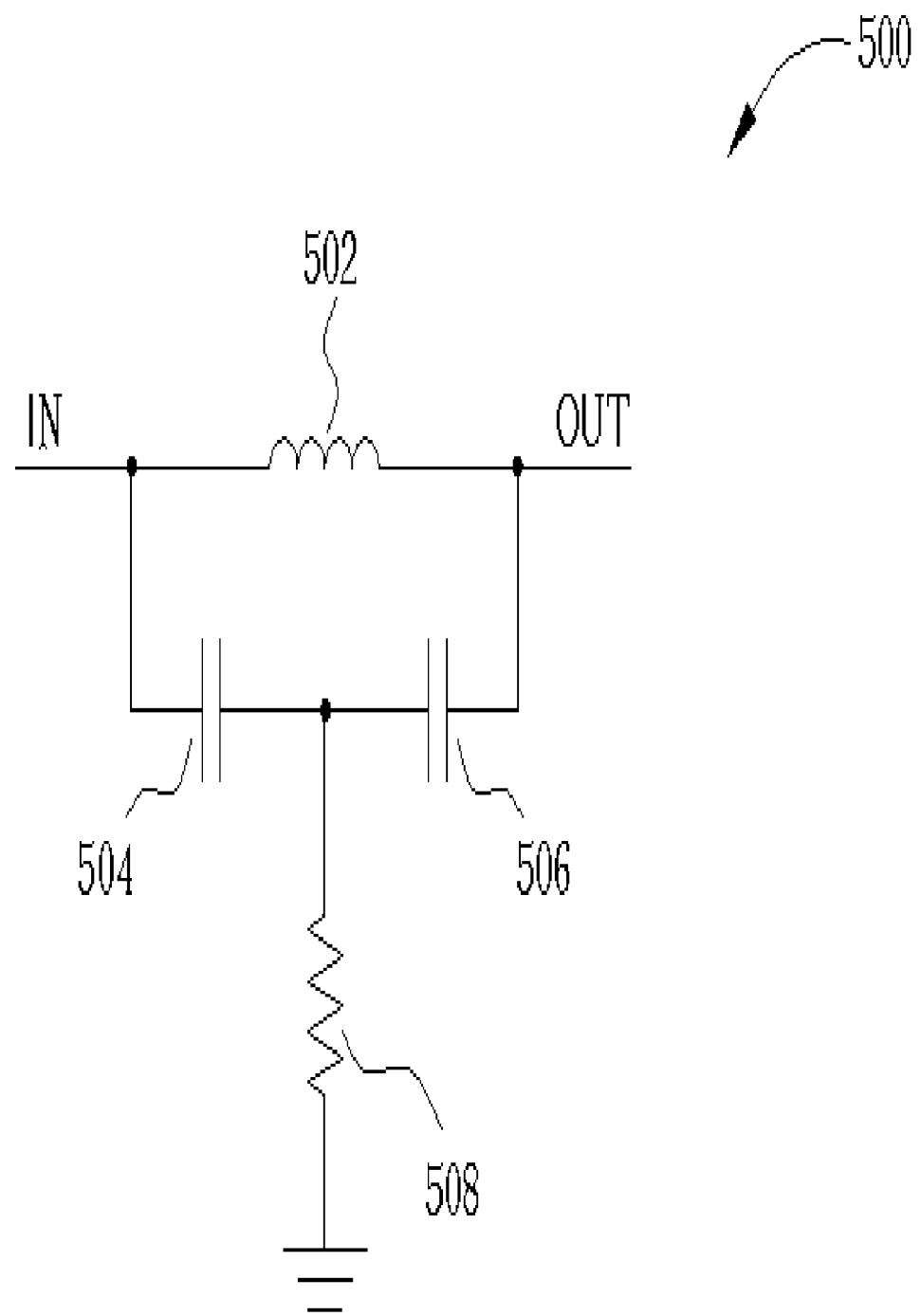
FIG. 5 is an implementation of the notch filter in FIG. 4.

FIG. 5 shows an implementation 500 of the passive notch filter 402 in FIG. 4. The notch filter 500 shown in FIG. 5 is a passive circuit and includes an inductor coupled between an input terminal (IN) of the notch filter 500 and an output terminal (OUT) of the notch filter 500. Additionally, a first capacitor 504 is coupled between the input terminal (IN) and a node A, a second capacitor 506 is coupled between the output terminal (OUT) and the node A, and a resistor 508 is coupled between the node A and ground. By using the passive notch filter 500 shown in FIG. 5, there is very little power consumed by the notch filter itself and the overall tuner design is greatly simplified. The passive implementation 500 shown in FIG. 5 is only an example of a suitable notch filter; in other embodiments of the present invention, other notch filter implementations can also be used.

It should also be noted that in FIG. 4 the order of connection of the notch filter 402 and the band-pass filter 106 could also be reversed. For example, in another embodiment of the present invention, the output (IF1) of the first mixer 102 is connected to the first band-pass filter 106, with the output of the first band-pass filter 106 being connected to the input of the notch-filter 402 and the output of the notch-filter 402 being connected to the input of the second mixer 108. According to the embodiments of the present invention, the band-pass filter 106 and the notch-filter 402 are connected in series to both directly attenuate the image signal 202 with the notch filter 402 and to attenuate all frequencies other than the desired signal 200 with the band-pass filter 106.

Figure 6:
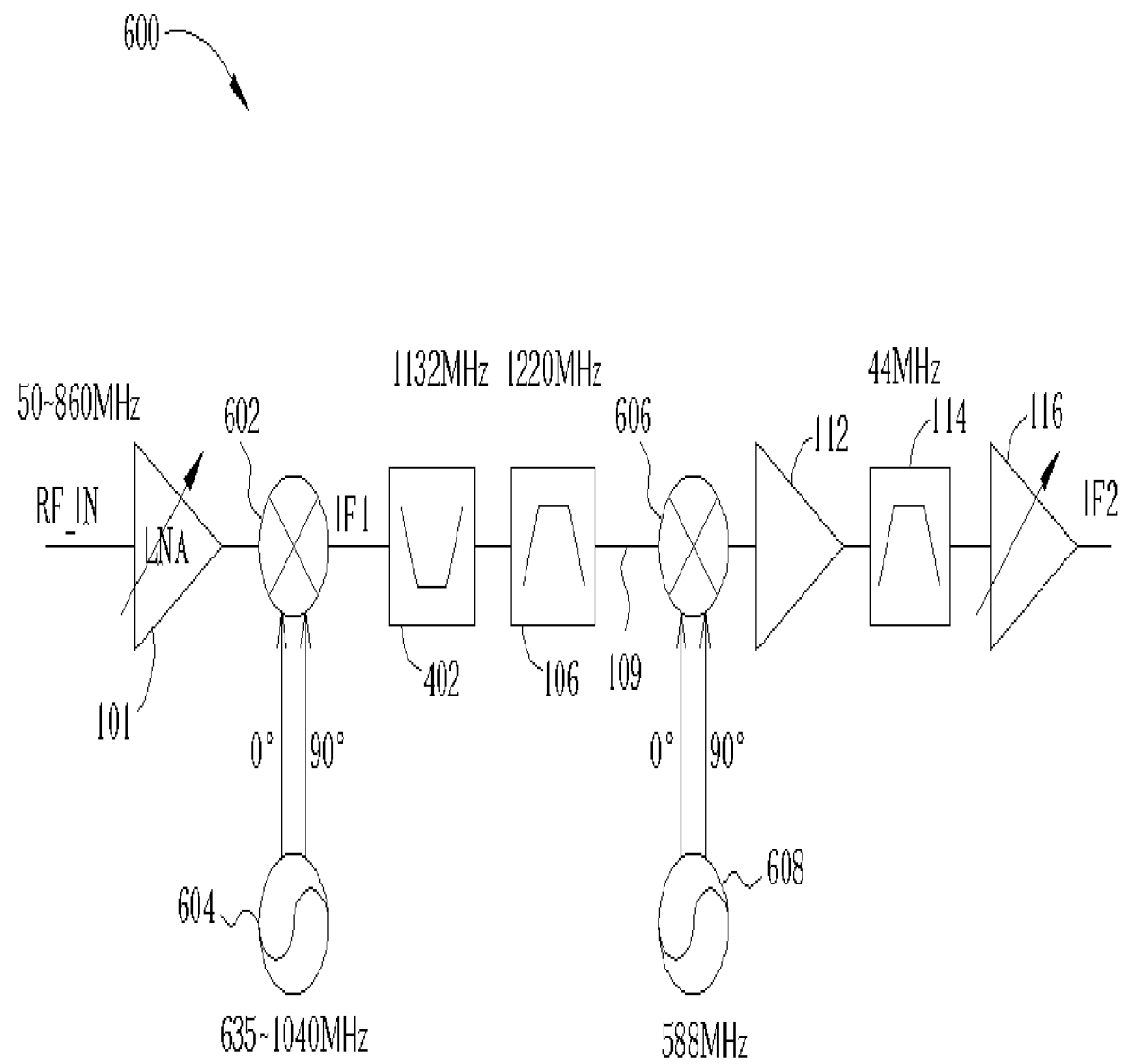
FIG. 6 is a block diagram showing the architecture of a television tuner according to a second embodiment of the present invention.

Other embodiments of the present invention are also possible. FIG. 6 shows the architecture of a television tuner 600 according to a second embodiment of the present invention. The television tuner 600 includes the adjustable low noise amplifier 101, a first harmonic mixer 602, a first local oscillator 604, the notch-filter 402, the first band-pass filter 106, a second harmonic mixer 606, a second local oscillator 608, the first intermediate frequency amplifier 112, the second band-pass filter 114, and the variable intermediate frequency amplifier 116. The operation and implementation of the harmonic mixer is explained in application Ser. No. 10/604018 as filed on Jun. 22, 2003, entitled "Passive Harmonic Mixer" and assigned to the same assignee, which is incorporated herein by reference. Because harmonic mixers 602, 606 are used, the first local oscillator 604 and the second local oscillator 608 run at half the frequency than those of FIG. 1 and FIG. 4. The first local oscillator 604 operates at a variable frequency range between 635 MHz to 1140 MHz and provides a 0° phase signal and a 90° phase signal. The second local oscillator 608 operates at a fixed frequency of 588 MHz and provides a 0° phase signal and a 90° phase signal. The use of the notch filter 402 in the second television tuner 600 further reduces the image signal 202 increasing the signal to noise ratio seen at the output.

Figure 7:
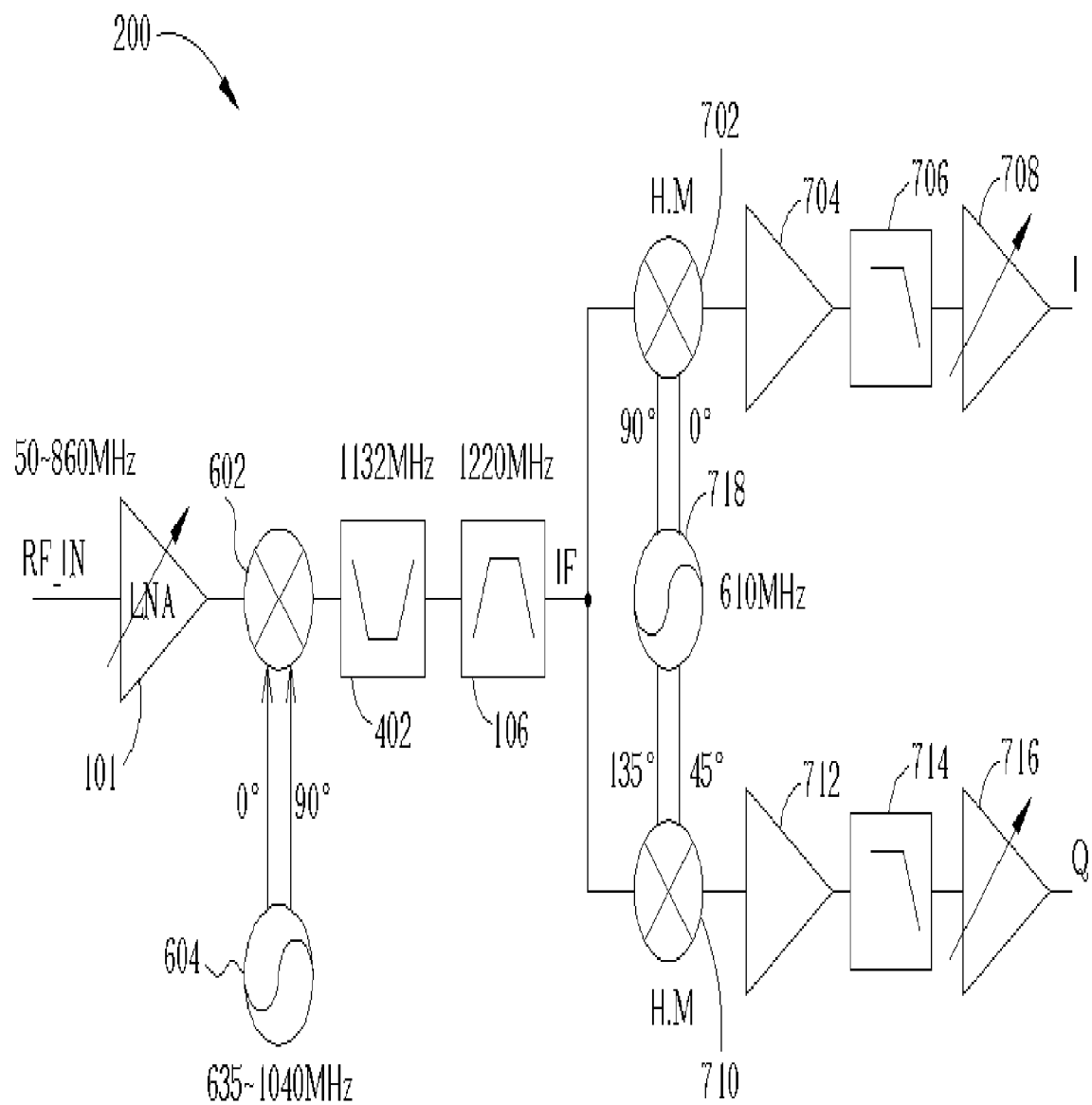
FIG. 7 is a block diagram showing the architecture of a television tuner according to a third embodiment of the present invention.

FIG. 7 shows the architecture of a television tuner 700 according to a third embodiment of the present invention. The television tuner 700 includes the adjustable low noise amplifier 101, the first harmonic mixer 602, the first local oscillator 604, the notch-filter 402, the band-pass filter 106, an in-phase harmonic mixer 702, an in-phase amplifier 704, an in-phase low-pass filter 706, an in-phase variable amplifier 708, a quadrature harmonic mixer 710, a quadrature amplifier 712, a quadrature low-pass filter 714, a quadrature variable amplifier 716, and a second local oscillator 718. The second local oscillator 718 operates at a fixed frequency of 610 MHz and provides a 0° phase-delayed signal, a 45° phase-delayed signal, a 90° phase-delayed signal, and a 135° phase-delayed signal. The output of the television tuner 700 is an in-phase baseband signal I and a quadrature baseband signal Q. The full operation and benefits of the harmonic architecture television tuner are further explained in application Ser. No. 10/707,319 as filed on Dec. 4th, 2003, entitled "Harmonic Mixer Based Television Tuner and Method of Processing a Received RF Signal" and assigned to the same assignee, which is incorporated herein by reference. The use of the notch filter 402 in the television tuner 700 further reduces the image signal 202 increasing the signal to noise ratio seen at the outputs I and Q.

Figure 8:
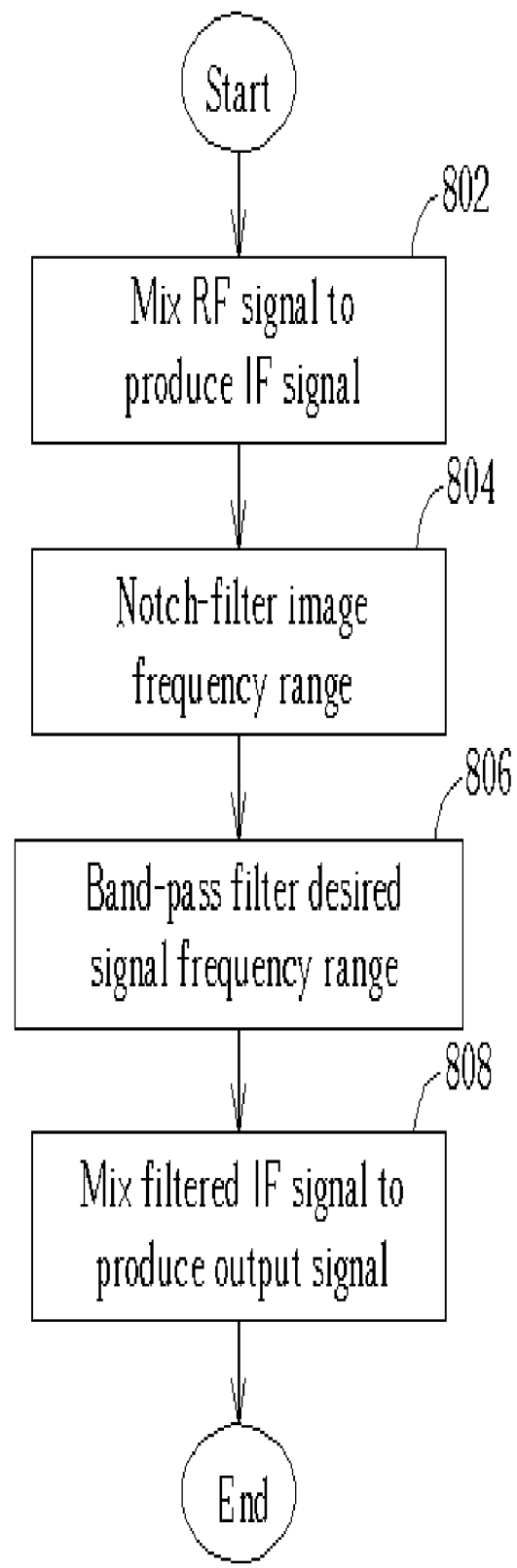
FIG. 8 is a flowchart describing a method for processing a received RF signal according to the embodiments of the present invention.

FIG. 8 shows a flowchart describing a method for processing a received RF signal according to the embodiments of the present invention. The flowchart contains the following steps:

Step 802: Mix the received RF signal with a first reference signal to produce an intermediate frequency signal having a desired signal positioned at a desired frequency in the intermediate frequency signal. Proceed to step 804.

Step 804: Remove a first range of frequencies centered at the frequency of the image signal from the intermediate frequency signal using a notch-filter. Proceed to step 806.

Step 806: Pass a second range of frequencies centered at the frequency of the desired signal in the intermediate frequency signal using a band-pass filter to produce a filtered intermediate frequency signal. Proceed to step 808.

Step 808: Mix the filtered intermediate frequency signal with a second reference signal to produce an output signal. Processing is complete.

It should be noted that the order of steps 804 and 806 is interchangeable. In other words, in another embodiment, the steps in the flowchart could proceed in the following order: 802→806→804→808.

Those skilled in the art will readily observe that numerous modifications and alterations of the device may be made while retaining the teachings of the invention. Accordingly, the above disclosure should be construed as limited only by the metes and bounds of the appended claims.

The invention claimed is:

1. A television (TV) tuner comprising:
   a first mixer for producing an intermediate frequency signal according to a received RF signal;
   a notch filter for filtering an image signal of the intermediate frequency signal, the notch filter comprising:
      a first passive circuit coupled between an input and an output of the notch filter;
      at least two frequency-dependent passive circuits coupled to the first passive circuit, the frequency-dependant passive circuits comprising at least a capacitor or an inductor; and
      a second passive circuit coupled to at least one of the frequency-dependent passive circuits;
   a band-pass filter for passing the intermediate frequency signal; and
   a second mixing unit for producing an output signal according to the passed intermediate frequency signal;
   wherein at least one of the frequency-dependent passive circuits or the second passive circuit couples to a constant reference voltage.

2. The TV tuner of claim 1, wherein the notch filter comprises:
   the first passive circuit being an inductor coupled between the input and the output of the notch filter;
   the frequency-dependent passive circuits being a first capacitor and a second capacitor respectively coupled to the input and the output of the notch filter; and the second passive circuit being a resistor coupled to the first capacitor, the second capacitor, and the constant reference voltage.

3. The TV tuner of claim 1, further including a first local oscillator for providing a first local oscillating signal to the first mixer, wherein the frequency of the first local oscillating signal is variable and is determined according to the frequency range of the received RF signal.

4. The TV tuner of claim 3, wherein the first mixer is a harmonic mixer and the first local oscillating signal further includes a first reference signal and a second reference signal being the first reference signal phase shifted by 90 degrees.

5. The TV tuner of claim 1, wherein the second mixing unit is a mixer and the TV tuner further includes a second local oscillator for providing a second local oscillating signal to the second mixing unit, wherein the frequency of the second local oscillating signal is fixed and is determined according to the frequency range of the received RF signal.

6. The TV tuner of claim 5, wherein the second mixing unit is a harmonic mixer and the second local oscillating signal further includes a third reference signal and a fourth reference signal, the fourth reference signal being the third reference signal phase shifted by 90 degrees.

7. The TV tuner of claim 1, wherein the second mixing unit further includes a third mixer for mixing the passed intermediate frequency signal to generate an in-phase baseband signal and a fourth mixer for mixing the passed intermediate frequency signal to generate a quadrature-phase baseband signal.

8. The TV tuner of claim 7, wherein the third mixer further includes a second local oscillator for providing a third local oscillating signal to the third mixer and a fourth local oscillating signal to the fourth mixer, wherein the frequency of the third and the fourth local oscillating signal is fixed and is determined according to the frequency range of the received RF signal and the fourth local oscillating signal being the third local oscillating signal phase shifted by 90 degrees.

9. The TV tuner of claim 8, wherein the third and the fourth mixers are harmonic mixers, the third local oscillating signal further includes a fifth reference signal and a sixth reference signal, and the fourth local oscillating signal further includes a seventh reference signal and a eighth reference signal, wherein the sixth reference signal is the fifth reference signal phase shifted by 90 degrees, the seventh reference signal is the fifth reference signal phase shifted by 45 degrees, and the eighth reference signal is the fifth reference signal phase shifted by 135 degrees.

10. The TV tuner of claim 1, wherein the first passive circuit is an inductor.

11. The TV tuner of claim 1, wherein the constant reference voltage is the ground voltage.

12. The TV tuner of claim 1, wherein the notch filter is a passive notch filter.

13. The TV tuner of claim 1, further comprising a first local oscillator for providing a first local oscillating signal to the first mixer, wherein the frequency range of the first local oscillating signal is narrower than the frequency range of the received RF signal.

14. The TV tuner of claim 13, wherein the frequency of the first local oscillating signal is lower than the frequency of the passed intermediate frequency signal.

15. The TV tuner of claim 13, wherein the frequency range of the received RF signal is a multiple of the frequency range of the first local oscillating signal.

* * * * *